United States Patent
Morishita et al.

(10) Patent No.: US 7,501,707 B2
(45) Date of Patent: Mar. 10, 2009

(54) MULTICHIP SEMICONDUCTOR PACKAGE

(75) Inventors: Yoshiaki Morishita, Kanagawa (JP);
Nobuteru Oh, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 222 days.

(21) Appl. No.: 11/072,258

(22) Filed: Mar. 7, 2005

(65) Prior Publication Data
US 2005/0199994 A1 Sep. 15, 2005

(30) Foreign Application Priority Data
Mar. 12, 2004 (JP) .............................. 2004-070763

(51) Int. Cl.
*H01L 23/48* (2006.01)
*H01L 23/52* (2006.01)
*H01L 29/40* (2006.01)
(52) U.S. Cl. ...................................... 257/777; 438/109
(58) Field of Classification Search ................. 257/777; 438/109
See application file for complete search history.

(56) References Cited

U.S. PATENT DOCUMENTS

| | | | | |
|---|---|---|---|---|
| 5,798,282 A | * | 8/1998 | Bertin et al. | 438/15 |
| 6,448,636 B2 | * | 9/2002 | Suenaga et al. | 257/678 |
| 6,781,240 B2 | * | 8/2004 | Choi | 257/777 |
| 6,833,626 B2 | * | 12/2004 | Kajiwara et al. | 257/777 |

FOREIGN PATENT DOCUMENTS

| | | |
|---|---|---|
| JP | 5-109977 A | 4/1993 |
| JP | 2000-22074 A | 1/2000 |
| JP | 2003-017655 A | 1/2003 |

* cited by examiner

*Primary Examiner*—Howard Weiss
(74) *Attorney, Agent, or Firm*—Sughrue Mion, PLLC (57) ABSTRACT

The semiconductor apparatus includes an upper semiconductor chip having an upper external terminal and a lower semiconductor chip having a lower bump for electrically connecting a lower external terminal and the upper external terminal. The circuit surfaces of the upper semiconductor chip and the lower semiconductor chip are electrically connected to each other via the bump. A low impedance line having lower impedance than the internal line of the lower semiconductor chip is formed on top of the lower semiconductor chip for electrically connecting the lower external terminal and the bump.

22 Claims, 6 Drawing Sheets

MULTICHIP SEMICONDUCTOR PACKAGE

BACKGROUND OF THE INVENTION

1. Field of the Invention

The present invention relates a semiconductor apparatus and a method for manufacturing the semiconductor apparatus. Particularly, the present invention relates a semiconductor apparatus including a plurality of stacked semiconductor chips and a method for manufacturing the semiconductor apparatus.

2. Description of Related Art

With rapid development of smaller and more sophisticated electronic equipment, demand for highly integrated semiconductor apparatus is increasing. In order to achieve higher integration of semiconductor apparatus, technologies such as System-On-Chip (SOC) and System in Package (SIP) are used. The SOC technology incorporates a plurality of functions into one semiconductor chip. The SIP technology stacks a plurality of semiconductor chips on one another and packages them in one semiconductor apparatus.

Because of process miniaturization of high integration and high density semiconductor apparatus into submicrons, the effect of signal integrity or signal waveform quality becomes more important. Low signal integrity causes problems such as crosstalk due to signal degradation and voltage drop or IR drop, which gives adverse effects to the operation of the semiconductor apparatus.

A semiconductor apparatus with Chip-On-Chip (COC) technology, which is one type of the SIP technology, includes two semiconductor chips bonded together by face-down bonding with their circuit surfaces facing each other. This specification uses the term "circuit surface" of a semiconductor chip to refer to the surface where a circuit such as LSI is formed, and "bottom surface" of a semiconductor chip to refer to the surface that is the reverse side of the circuit surface.

Figure 5:
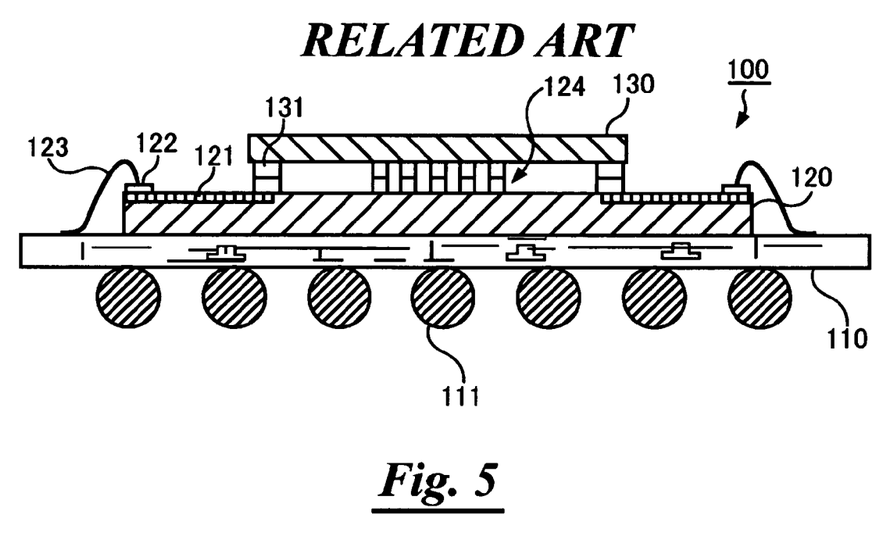
FIG. 5 is a schematic cross-sectional view of a conventional semiconductor apparatus.

FIG. 5 is a schematic cross-sectional view of a conventional COC type semiconductor apparatus. This semiconductor apparatus 100 has a package substrate 110, a lower semiconductor chip 120, and an upper semiconductor chip 130.

The lower semiconductor chip 120 is placed on a mounting surface of the package substrate 110. This specification uses the term "mounting surface" of a package substrate to refer to the surface where a semiconductor chip is mounted, and "bottom surface" of a package substrate to refer to the surface that is the reverse side of the mounting surface.

A package external terminal 111 such as a solder ball is formed on the bottom surface of the package substrate 110. Lines and through holes are formed inside the package substrate 110.

In the lower semiconductor chip 120, a lower chip internal line 121 such as a multilayer thin film line is formed on the circuit surface, and a lower external terminal 122 such as a pad is formed in the peripheral part of the circuit surface. Further, an internal circuit and a lower internal terminal are formed in the central part of the circuit surface of the lower semiconductor chip 120, though not shown.

In the upper semiconductor chip 130, an upper external terminal 131 is formed in the peripheral part of the circuit surface. Further, an internal circuit and an upper internal terminal are formed in the central part of the circuit surface of the upper semiconductor chip 130, though not shown.

The package external terminal 111 and a line on the mounting surface of the package substrate 110 are electrically connected via a through hole or the like inside the package substrate 110. The line on the mounting surface of the package substrate 110 and the lower external terminal 122 are electrically connected by a bonding wire 123. The lower chip internal line 121 and the upper external terminal 131, and a lower internal terminal and an upper internal terminal are respectively electrically connected to each other via a bump 124.

The semiconductor apparatus 100 supplies power to the package external terminal 111 to activate internal circuits of the lower semiconductor chip 120 and the upper semiconductor chip 130. The power is supplied to the internal circuit of the lower semiconductor chip 120 through the package external terminal 111 and the lower external terminal 122. The power is supplied to the internal circuit of the upper semiconductor chip 130 through the package external terminal 111, the lower external terminal 122, the lower chip internal line 121, the bump 124, and the upper external terminal 131.

Hence, the power whose voltage is dropped by the resistance of the lower chip internal line 121 or the like is supplied to the internal circuit of the upper semiconductor chip 130. Thus, the effect of the signal integrity is more significant on power supply to the internal circuit of the upper semiconductor chip 130 than on power supply to the internal circuit of the lower semiconductor chip 120.

With the miniaturization in the semiconductor process, current consumption of a single chip increases, and power supply voltage drop, which is determined by the product of a consumption current and a power line resistance, increases accordingly. Thus, a decrease in power supply voltage drop is required.

Further, with a decrease in the size of a logic chip and an increase in the capacity of a memory to be mounted, cases that use a logic chip for the upper semiconductor chip 130 and a memory chip for the lower semiconductor chip 120, instead of using a memory chip for the upper semiconductor chip 130 and a logic chip for the lower semiconductor chip 120, are increasing. In such cases, power supply voltage drop significantly affects the operation of the logic chip.

Further, since a rated drive voltage decreases with the decrease in the size of a logic chip, the sensitivity for power supply voltage drop becomes higher. This results in a decrease in the power consumption value allowed in the peripheral pad configuration that makes an electrical connection from a peripheral pad to a package external terminal such as the semiconductor apparatus 100. This imposes more severe restriction on the power consumption for a single chip due to voltage drop.

The COC structure such as the semiconductor apparatus 100 needs to supply all the consumption power to the upper and lower semiconductor chips from the lower external terminal 122 of the lower semiconductor chip 120. It is thereby difficult to take measures to suppress the voltage drop at the single chip level.

Particularly, the power is supplied to the upper semiconductor chip 130 through the lower chip internal line 121 between the lower external terminal 122 and the upper external terminal 131. The lower chip internal line 121 is formed by a semiconductor chip fabrication process and has higher resistance than a bonding wire or the like. Thus, it is required to consider the voltage drop occurring in the lower chip internal line 121 in addition to the voltage drop occurring in a single chip of the upper semiconductor chip 130.

Further, power supply inductance increases due to the lower chip internal line 121, and a simultaneous switching noise determined by the product of inductance and current shift increases accordingly. This causes a lower operation speed and circuit malfunction.

A semiconductor apparatus with the COC technique is described in Japanese Unexamined Patent Application Publication No. 2003-17655, for example. This semiconductor apparatus, however, forms an insulation layer on the circuit surface of a semiconductor chip in a semiconductor packaging process.

As described in the foregoing, the present invention has recognized that a conventional semiconductor apparatus that packages a plurality of semiconductor chips stacked on one another is affected by signal integrity more significantly than the configuration with a single semiconductor chip, causing power supply voltage drop. Further, the power supply voltage drop causes lower operation speed and malfunction and reduces power consumption allowance. Furthermore, an increase in the inductance of a power supply line leads to a higher simultaneous switching noise.

SUMMARY OF THE INVENTION

According to one aspect of the present invention, there is provided a semiconductor apparatus including a first semiconductor chip having an external connection terminal, a second semiconductor chip placed below the first semiconductor chip, a bump electrically connecting circuit surfaces of the first semiconductor chip and the second semiconductor chip, and a low impedance line formed on top of the second semiconductor chip, electrically connecting the external connection terminal of the first semiconductor chip and an external line of the second semiconductor chip, and having lower impedance than an internal line of the second semiconductor chip. Since this semiconductor apparatus makes an electrical connection through the low impedance line, it allows lowering the impedance from the external line to the external connection terminal of the first semiconductor chip. This ensures signal integrity to suppress signal degradation and power supply voltage drop.

According to another aspect of the present invention, there is provided a semiconductor apparatus manufacturing method, including forming a first bump on a circuit surface of a first semiconductor chip having an external connection terminal, forming a second bump on a circuit surface of a second semiconductor chip and forming a low impedance line having lower impedance than an internal line of the second semiconductor chip on the circuit surface of the second semiconductor chip, electrically connecting the first bump and the second bump and electrically connecting the first bump and the low impedance line with the circuit surfaces of the first and the second semiconductor chips facing each other, and electrically connecting an external line of the second semiconductor chip and the low impedance line. Since this method makes an electrical connection through the low impedance line, it allows manufacturing the semiconductor apparatus in which the impedance from the external line to the external connection terminal of the first semiconductor chip is low. This ensures signal integrity to suppress signal degradation and power supply voltage drop.

According to still another aspect of the present invention, there is provided a semiconductor apparatus including a first semiconductor chip having a first pad, a second semiconductor chip having a connection line electrically connecting the first pad and an external line, wherein the connection line is formed on top of the second semiconductor chip and has lower impedance than an internal line of the second semiconductor chip. Since this semiconductor apparatus makes an electrical connection through the low impedance line, it allows lowering the impedance from the external line to the first pad of the first semiconductor chip. This ensures signal integrity to suppress signal degradation and power supply voltage drop.

The present invention provides a semiconductor apparatus which can reduce the effect of signal integrity when packaging a plurality of semiconductor chips stacked on one another, thereby suppressing power supply voltage drop.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed. In the description of the drawings the same elements will be denoted by the same reference symbols and redundant description will be omitted.

First Embodiment

Figure 1:
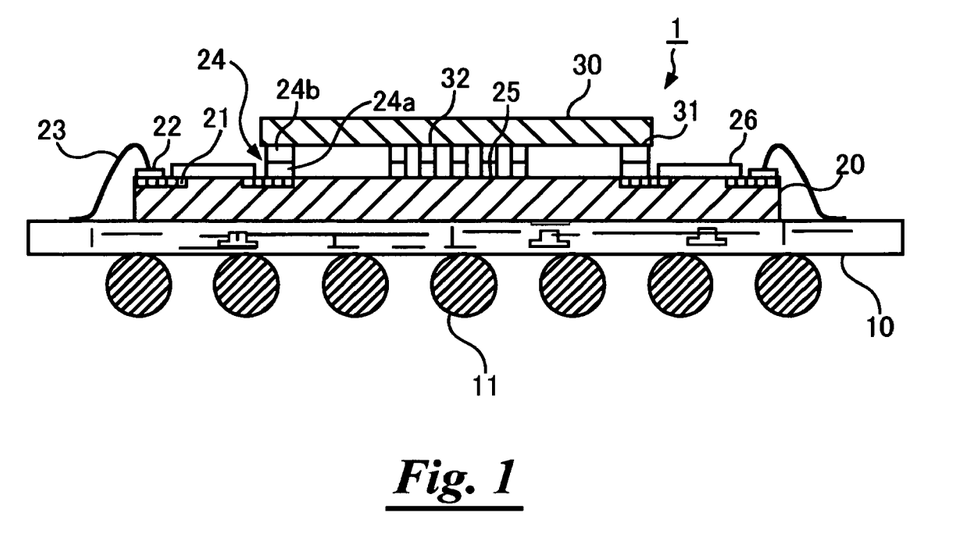
FIG. 1 is a schematic cross-sectional view of a semiconductor apparatus of the present invention.
Figure 2:
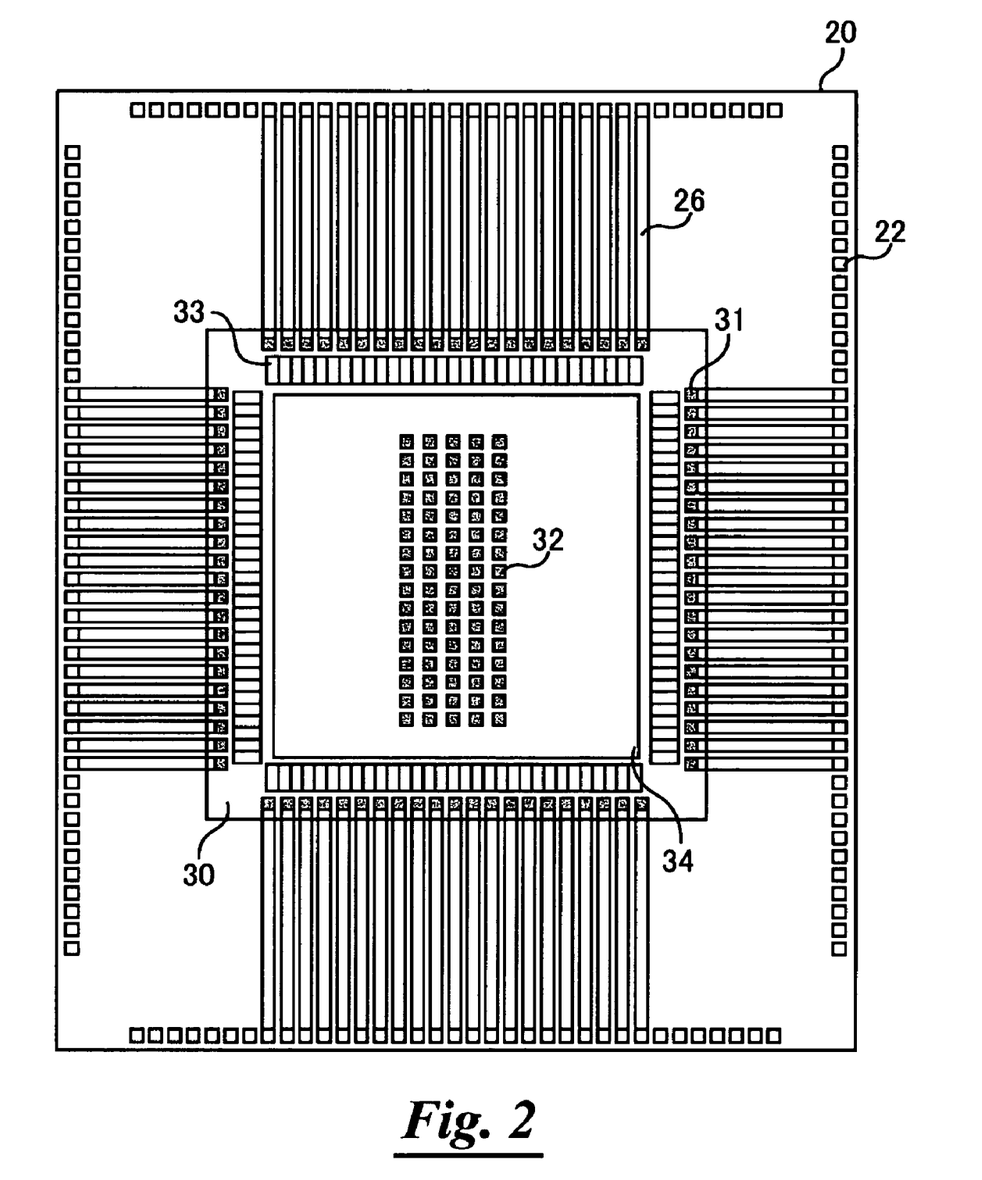
FIG. 2 is a schematic plan view of a semiconductor apparatus of the present invention.

The configuration of a semiconductor apparatus according to a first embodiment of the invention is described hereinafter with reference to FIGS. 1 and 2. In the semiconductor apparatus of this embodiment, a lower semiconductor chip has a low impedance line that transmits an external signal. FIG. 1 is a schematic cross-sectional view of the semiconductor apparatus of this embodiment. FIG. 2 is a schematic plan view of the semiconductor apparatus of this embodiment.

The semiconductor apparatus 1 of this embodiment uses the SIP technology which packages a plurality of semiconductor chips fabricated by a semiconductor chip fabrication process such as a LSI fabrication process (diffusion process) by stacking them on top of each other in a semiconductor packaging process. This embodiment describes a COC type semiconductor apparatus including two semiconductor chips as an example.

Referring first to FIG. 1, the semiconductor apparatus 1 includes a package substrate 10, a lower semiconductor chip 20 (second semiconductor chip), and an upper semiconductor chip 30 (first semiconductor chip). The semiconductor apparatus 1 is a COC type semiconductor apparatus in which a lower semiconductor chip 20 and an upper semiconductor chip 30 placed above the lower semiconductor chip 20 are bonded together with their circuit surfaces facing each other. The mounting surface of the package substrate 10, the lower semiconductor chip 20, and the upper semiconductor chip 30 are sealed by a sealing resin, which is not shown.

The lower semiconductor chip 20 is mounted on the mounting surface of the package substrate 10. A package external terminal 11 such as a solder ball is formed on the bottom surface of the package substrate 10. The package substrate 10 has lines and through holes inside.

The lower semiconductor chip 20 has a larger circuit area than the upper semiconductor chip 30. The lower semiconductor chip 20 and the upper semiconductor chip 30 are LSI chips or the like. They may be chips of the same function or different functions.

For example, when making a COC structure with a combination of a logic chip such as application specific IC (ASIC) and a memory chip such as DRAM, due to process miniaturization and memory capacity increase, the memory chip size is subject to be larger than the logic chip size. Thus, it is preferred in terms of manufacture to use a memory chip for the lower semiconductor chip 20 an a logic chip for the upper semiconductor chip 30.

The circuit surface of the lower semiconductor chip 20 has a lower chip internal line 21 such as a multi-layer thin film line in the peripheral part and a part facing the peripheral part of the upper semiconductor chip 30. The circuit surface of the lower semiconductor chip 20 also has a lower external terminal 22 such as a pad in the peripheral part. Further, the circuit surface of the lower semiconductor chip 20 has an internal circuit, not shown, and a lower internal terminal 25 in its central part. Furthermore, lower bumps 24a made of Au are formed on the lower chip internal line 21 facing the peripheral part of the upper semiconductor chip 30, which is a chip connection terminal electrically connected to the upper external terminal 31, and on the lower internal terminal 25. The lower bumps 24a are each electrically connected to upper bumps 24b. The lower chip internal line 21 and the lower internal terminal 25 serve as terminals to electrically connect the lower semiconductor chip 20 to the upper semiconductor chip 30.

In this embodiment, the circuit surface of the lower semiconductor chip 20 has a low impedance line 26 that extends from the peripheral part to the part facing the peripheral part of the upper semiconductor chip 30. The low impedance line 26 is a thick film line made of Au. The film thickness of the low impedance line 26 is larger than that of the lower chip internal line 21, and it is for example several μm to several tens of μm. For instance, the lower chip internal line 21 has the film thickness of 2 μm, and the low impedance line 26 has the film thickness of 20 μm. The line resistance and inductance per unit line length and unit line width from the lower external terminal 22 to the internal circuit thereby decrease to one severalth to several tenth. The low impedance line 26 is not limited to this example as long as it has a lower impedance than the lower chip internal line 21. For example, the low impedance line 26 may have a larger length, larger width, or be made of a lower impedance material.

The low impedance line 26 is preferably formed directly on top of the circuit surface of the lower semiconductor chip 20. Thus, the low impedance line 26 is formed directly on the circuit surface of the lower semiconductor chip 20 formed in a semiconductor chip fabrication process without forming another layer in a semiconductor chip packaging process. The circuit surface of the lower semiconductor chip 20 formed in the semiconductor chip fabrication process already has the lower chip internal line 21, the lower internal terminal 25, and the internal circuit. The lower semiconductor chip 20 is thus a semiconductor chip fabricated by a normal semiconductor chip fabrication process, and the low impedance line 26 is directly formed on the lower semiconductor chip 20. It is thereby possible to make SIP structure such as COC easily using a general semiconductor chip.

The circuit surface of the upper semiconductor chip 30 has an upper external terminal 31, which is an external connection terminal of the upper semiconductor chip 30, in the peripheral part. Further, the circuit surface of the upper semiconductor chip 30 has an internal circuit, not shown, and an upper internal terminal 32 in the central part. Upper bumps 24 made of Au are formed on the upper external terminal 31 and the upper internal terminal 32. The upper bumps 24 are electrically connected to the lower bumps 24a. The upper external terminal 31 and the upper internal terminal 32 serve as terminals to electrically connect the upper semiconductor chip 30 to the lower semiconductor chip 20.

The package external terminal 11 and a line on the mounting surface of the package substrate 10 are electrically connected by a through hole or the like inside the package substrate 10. The line on the mounting surface of the package substrate 10 and the lower external terminal 22 serving as an external connection terminal of the lower semiconductor chip 20 are electrically connected by a bonding wire 23, which is an external line. The line of the package substrate 10 and the lower external terminal 22 may be electrically connected by a lead frame, Tape Automated Bonding (TAB), or Flip-Chip (FC) instead of the bonding wire 23.

The lower chip internal line 21 and the upper external terminal 31, and the lower internal terminal 25 and the upper internal terminal 32 are respectively electrically connected to each other by bonding the lower bump 24a and the upper bump 24b. A combination of the lower bump 24a and the upper bump 24b bonded together forms a bump 24.

On the circuit surface of the lower semiconductor chip 20, the low impedance line 26 electrically connects the lower chip internal line 21 in the peripheral part and the lower chip internal line 21 in the part facing the peripheral part of the upper semiconductor chip 30. The lower external terminal 22 and the lower bump 24a are electrically connected through the lower chip internal line 21 and the low impedance line 26.

The semiconductor apparatus 1 supplies power to the package external terminal 11 to activate internal circuits of the lower semiconductor chip 20 and the upper semiconductor chip 30. The power is supplied to the internal circuit of the lower semiconductor chip 20 through the package external terminal 11 and the lower external terminal 22. The power is supplied to the internal circuit of the upper semiconductor chip 30 through the package external terminal 11, the lower external terminal 22, the lower chip internal line 21, the low impedance line 26, the bump 24, and the upper external terminal 31.

Supplying power to the internal circuit of the upper semiconductor chip 30 through the low impedance line 26 reduces impedance from the power supply to the upper semiconductor chip 30. This can prevent significant voltage drop in the power supply voltage. The power may be supplied through the low impedance line 26 not only to the internal circuit of the upper semiconductor chip 30 but also to the internal circuit of the lower semiconductor chip 20 or to the internal circuits of both the upper semiconductor chip 30 and the lower semiconductor chip 20.

Though the lower bump 24a and the low impedance line 26 are electrically connected through the lower chip internal line 21 in this example, they may be electrically connected through an input/output buffer of the lower semiconductor chip 20.

Referring next to FIG. 2, on the circuit surface of the lower semiconductor chip 20, the lower external terminals 22 are arranged in the peripheral part at a given pad pitch. On the circuit surface of the upper semiconductor chip 30, the upper external terminals 31 are arranged in the peripheral part at the same pitch as the lower external terminals 22.

On the circuit surface of the upper semiconductor chip 30, input/output terminals 33 are formed along the upper external terminal 31 on the central part side. An area on the inner side of the input/output terminals 33 is an internal circuit area 34. In the internal circuit area 34, the upper internal terminals 32 are arranged in a reticular pattern, for example.

The upper external terminals 31 are each electrically connected to the lower external terminals 22 by the low impedance line 26. Each upper external terminal 31 and each lower external terminal 22 may be electrically connected only through the low impedance line 26 or further through another circuit or the like. For example, it is possible to place a protection circuit which protects power supply form plasma damage or the like between the upper external terminal 31 and the lower external terminal 22 so as to electrically connect the upper and the lower external terminals 31 and 22 through this protection circuit in addition to the low impedance line 26.

Though all the upper external terminals 31 may be electrically connected to the lower external terminals 22 through the low impedance lines 26, it is preferred that only some of the upper external terminals 31 are electrically connected thereto through the low impedance lines 26. For example, it is preferred to electrically connect only the upper external terminal 31 for power supply through the low impedance lines 26 and electrically connect the other upper external terminals 31 through the lower chip internal lines 21. If the low impedance line 26 is a plated thick film line, making only the lines electrically connected to some upper external terminals 31 as thick film lines allows avoiding an excessive use of plating. Further, if all the lines electrically connected to the upper external terminal 31 are thick film lines, uneven surface of the thick film lines can cause voids to occur in a sealing resin in a sealing process. Forming only the lines electrically connected to some of the upper external terminals 31 as thick film lines can prevent the voids from occurring in the sealing resin.

Though the low impedance line 26 is illustrated as a straight line in FIG. 2, it may be various shapes according to design of the internal circuit.

Referring next to FIGS. 3A to 3F, a method for manufacturing a semiconductor apparatus according to the present invention is described hereinafter. FIG. 3 shows the manufacturing method of the semiconductor apparatus 1 in a semiconductor packaging process.

Figure 3A:
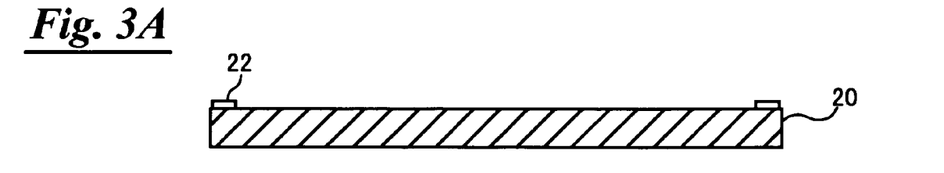
FIGS. 3A to 3F are cross-sectional views illustrating a method for manufacturing a semiconductor apparatus of the present invention.

As shown in FIG. 3A, the lower semiconductor chip 20 that has the lower external terminal 22 on the peripheral part of the circuit surface is prepared. The circuit surface of the lower semiconductor chip 20 further has the lower internal terminal 25, the lower chip internal line 21, and an internal terminal such as LSI. These elements are formed in the semiconductor chip fabrication process. The lower semiconductor chip 20 may be a chip or a wafer having a plurality of chips. If the lower semiconductor chip 20 is a wafer, it is cut into chip pieces by dicing before bonding the lower bump 24a and the upper bump 24b together.

Figure 3B:
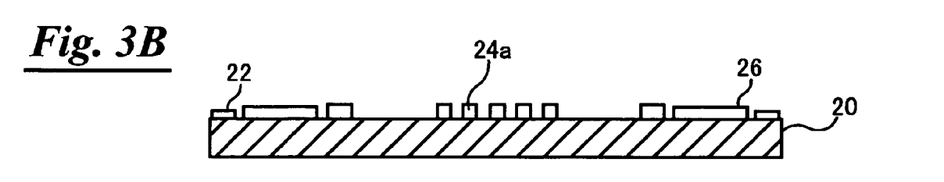

Then, as shown in FIG. 3B, the lower bump 24a and the low impedance line 26 are formed on the circuit surface of the lower semiconductor chip 20. For example, the lower bump 24a made of Au and the low impedance line 26 are formed by plating such as electroless plating. They may be formed by exposing an Al electrode of a plating area and performing plating on the Al electrode with Ni or Au. It is also possible to deposit a barrier layer such as Ni and Ti on the Al electrode and form the lower bump 24a made of Cu and the low impedance line 26 on top of the barrier layer.

Though the lower bump 24a and the low impedance line 26 may be formed by different processes, they are preferably formed in the same plating process. This eliminates the need for additional manufacturing process and allows the lower bump 24a and the low impedance line 26 to have the same height easily. The technique to form the lower bump 24a and the low impedance line 26 is not necessarily the electroless plating as long as they are formed in the same process. For example, electrolytic plating, ball bonding, solder ball, printing, or transcription may be used instead.

After that, the upper semiconductor chip 30 is prepared just like FIGS. 3A and 3B. The upper bumps 24b are formed on the upper external terminal 31 and the upper internal terminal 32.

Figure 3C:
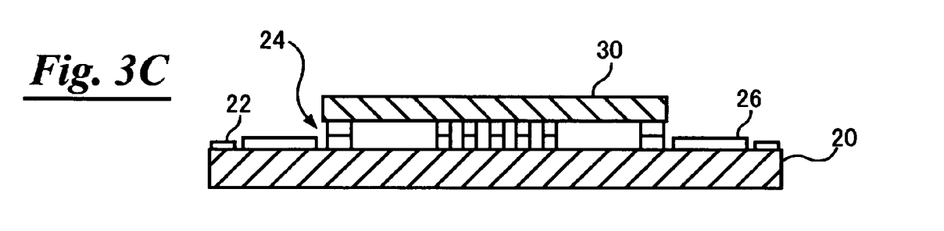

Then, as shown in FIG. 3C, the lower semiconductor chip 20 and the upper semiconductor chip 30 are placed in such a way that their circuit surfaces face each other, and the lower bump 24a and the upper bump 24b are aligned. Then, the bottom surfaces of the lower semiconductor chip 20 and the upper semiconductor chip 30 are heated under pressure with a tool or the like, thereby bonding them together.

Figure 3D:
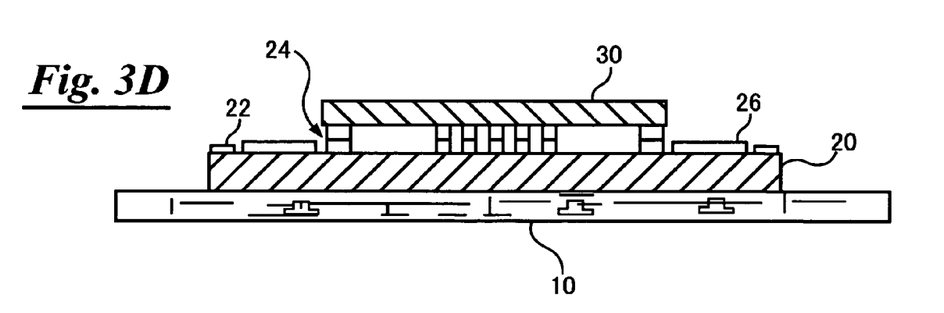

Next, as shown in FIG. 3D, the package substrate 10 having through holes and lines inside is prepared. The bottom surface of the lower semiconductor chip 20 is bonded to the package substrate 10 by a bond or the like.

Figure 3E:
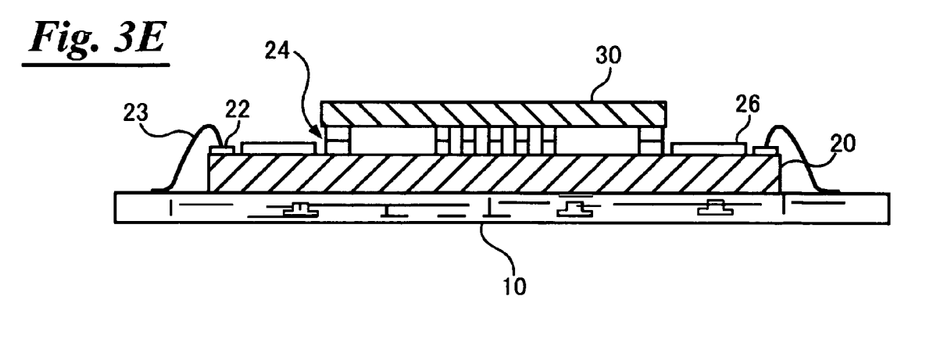

Then, as shown in FIG. 3E, the lower external terminals 22 and the lines of the package substrate 10 are electrically connected by the bonding wires 23 made of Au, Al, and so on. The electrical connection is made by ball bonding using a ball bonder or ultrasonic wire bonding using a wire bonder, for example.

Figure 3F:
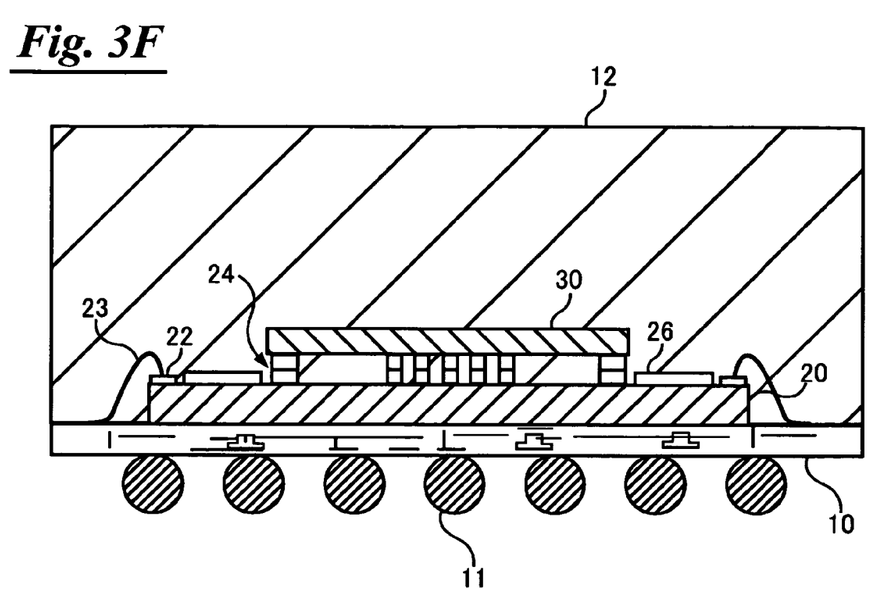

Finally, as shown in FIG. 3F, after sealing the elements by a sealing resin 12, the package external terminal 11 such as a solder ball is formed. Specifically, the mounting surface of the package substrate 10, the lower semiconductor chip 20, the upper semiconductor chip 30, and so on are molded by epoxy resin or the like and sealed. After that, solder balls are placed on the bottom surface of the package substrate 10 by micropressing or printing and formed by reflowing. The semiconductor apparatus 1 is thereby produced.

As described above, this embodiment places the low impedance line 26 on the lower semiconductor chip 20 to lower the impedance in the lines from the lower external terminals 22 in the peripheral part of the lower semiconductor chip 20 to the internal circuits of the upper and lower semiconductor chips compared to the conventional technique of FIG. 5. This ensures the signal integrity and reduces signal degradation, which provides various effects.

Use of the low impedance line for a power supply line of both or either of the upper and the lower semiconductor chips results in a decrease in the resistance and inductance of the power supply line. Since power supply voltage drop is determined by the product of power supply line resistance and consumption current, it is possible to suppress power supply voltage drop. Further, since dynamic power supply noise is determined by the product of power supply inductance and power supply current shift, it is possible to increase the resistance to the dynamic power supply noise. This allows increasing the power consumption allowance of both or either of the semiconductor chips.

When performing electroless plating in the plating process in the above manufacturing method, it is possible to selectively form a thick film line by opening a place to form the line with a cover mask of a top layer metal. When performing electrolytic plating also, it is possible to form a thick film layer at the same time as forming a plated bump by previously forming a thick film line pattern on a photomask pattern for plated bump formation. Thus, no additional process is required for forming a thick film line. Since an additional cost is thereby only for a plating material, it is possible to reduce the risk of power supply voltage drop to improve the quality with a slight increase in the plating material cost.

The above effect is significant especially when using a memory chip for the lower semiconductor chip 20 and a logic chip for the upper semiconductor chip 30 since the chip power consumption is likely to be higher in the logic chip and thus the power supply to the upper logic chip is important.

Second Embodiment

Figure 4:
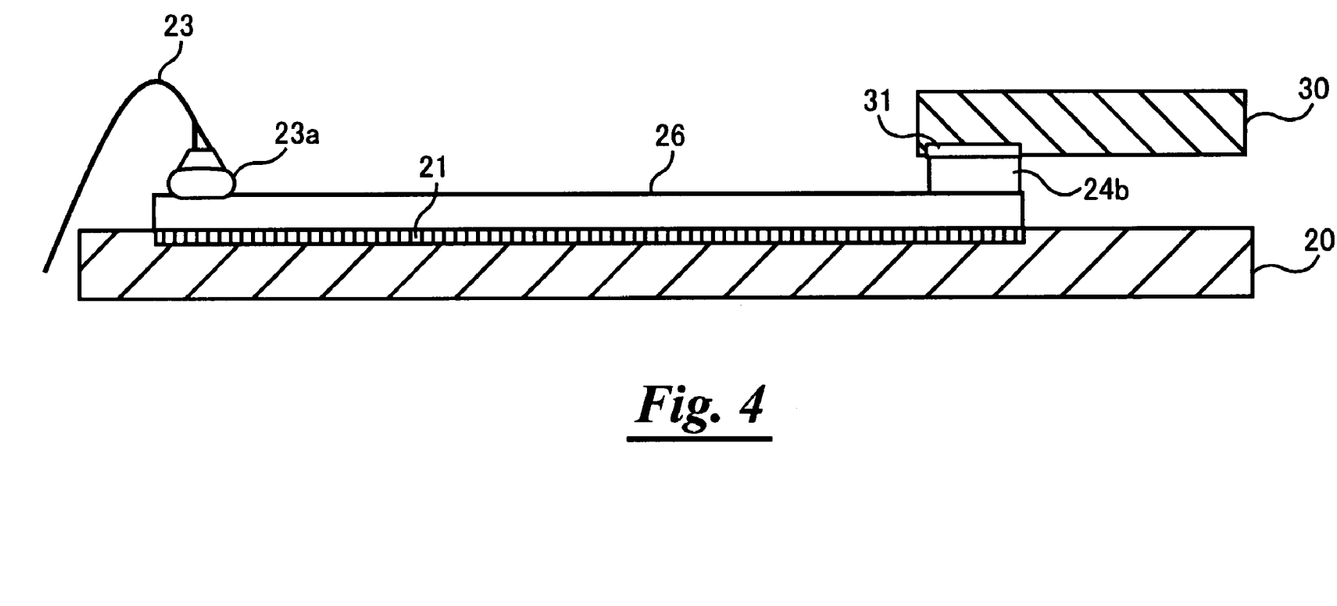
FIG. 4 is an enlarged schematic view of the cross-section of a semiconductor apparatus of the present invention.

Referring now to FIG. 4, the configuration of a semiconductor apparatus according to a second embodiment of the invention is described hereinafter. In this semiconductor apparatus, the external line and the upper semiconductor chip are directly electrically connected to the low impedance line of the lower semiconductor chip. FIG. 4 is a schematic cross-sectional view that enlarges the part including the low impedance line of the semiconductor apparatus of this embodiment. The configuration of this semiconductor apparatus is the same as those illustrated in FIGS. 1 and 2 except for the part illustrated in FIG. 4, and thus not described below.

In this semiconductor apparatus 1, the low impedance line 26 having the same length as the lower chip internal line 21 is formed on the lower chip internal line 21. The bonding wire 23 is directly electrically connected to the low impedance line 26 by bonding using a bonding ball 23a. Instead of the bonding wire 23, a lead frame or the like maybe directly electrically connected to the low impedance line 26.

Further, the upper bump 24b is also directly electrically connected to the low impedance line 26. Thus, the bonding wire 23 and the upper bump 24b are electrically connected only through the low impedance line 26 without through the lower external terminal 22 and the lower bump 24a of FIG. 1.

This configuration allows further reducing the impedance from the power supply to the upper semiconductor chip 30. The effect of the signal integrity thereby further decreases to more surely suppress the voltage drop in a power supply voltage to the internal circuit of the upper semiconductor chip 30.

Though this example forms the low impedance line 26 on the lower chip internal line 21, it is possible to form the low impedance line 26 on the circuit surface with no lower chip internal line 21 and electrically connect the bonding wire 23 and the upper bump 24b only through the low impedance line 26 without the lower chip internal line 21.

In this configuration, by equalizing the heights of the lower bump 24a and the low impedance line 26, integrating them together, and extending the low impedance line 26 to the lower external terminal 22, the low impedance line 26 can provide an electrical connection from the bonding wire 23 to the upper bump 24b. This further reduces the impedance and enhances the effect of suppressing the power supply voltage drop.

Though the above embodiments describe the case of supplying power through the low impedance line or the like, the low impedance line may be used for another input/output line signal. If the low impedance line is applied to a clock line or a global signal line, the resistance per unit line length decreases to suppress RC delay per unit line length. Thus, if the drive capacity of an outputting transistor is the same, a drivable line length increases to reduce the number of times of repeater insertion.

Further, when electrically connecting from a peripheral pad or an external terminal of the upper semiconductor chip to an external peripheral pad or an external terminal through the bump and the low impedance line of the lower semiconductor chip, the drive capacity required in the chip decreases, which extends the drive length after the package external terminal.

Though the above embodiments describe the case of mounting two semiconductor chips on the package substrate, it is not limited thereto, and a given number of semiconductor chips may be mounted. For example, it is possible to place a spacer substrate between the lower semiconductor chip 20 formed of a logic chip and the upper semiconductor chip 30 formed of a memory chip larger than the logic chip.

Further, though the above embodiments describe the case of applying this invention to the SiP structure with the COC technology, it is not limited thereto, and it may be applied to another SiP structure having a plurality of semiconductor chips. For example, use of the above low impedance line in the configuration that transmits a signal input from an external line to another semiconductor chip provides the same effect.

It is apparent that the present invention is not limited to the above embodiment that may be modified and changed without departing from the scope and spirit of the invention.

What is claimed is:

1. A semiconductor apparatus comprising:
a first semiconductor chip having an external connection terminal;
a second semiconductor chip placed below the first semiconductor chip;
a bump electrically connecting a circuit surface of the first semiconductor chip and a circuit surface of the second semiconductor chip; and
a low impedance line formed on top of the second semiconductor chip, electrically connecting the external connection terminal of the first semiconductor chip and an external line of the second semiconductor chip, and having lower impedance than an internal line of the second semiconductor chip,
wherein the first semiconductor chip has the external connection terminal at a peripheral part of the first semiconductor chip, and the external connection terminal is provided closer to a periphery of the first chip than the bump is provided to the periphery of the first chip, and
there is no inclusion of independent circuit elements within the internal line.

2. The semiconductor apparatus of claim 1, wherein
the external connection terminal of the first semiconductor chip is electrically connected directly to the low impedance line through another bump, and
the external line of the second semiconductor chip is electrically connected directly to the low impedance line.

3. The semiconductor apparatus of claim 1, wherein
the second semiconductor chip further comprises an external connection terminal and a chip connection terminal,
the low impedance line and the external connection terminal of the first semiconductor chip are electrically connected through the chip connection terminal, and
the low impedance line and the external line of the second semiconductor chip are electrically connected through the external connection terminal of the second semiconductor chip.

4. The semiconductor apparatus of claim 3, wherein the low impedance line electrically connects the external connection terminal and the chip connection terminal of the second semiconductor chip directly or through the internal line of the second semiconductor chip.

5. The semiconductor apparatus of claim 1, wherein the low impedance line has a larger film thickness than the internal line of the second semiconductor chip.

6. The semiconductor apparatus of claim 1, wherein the low impedance line is a line for supplying power to the first semiconductor chip and/or the second semiconductor chip.

7. The semiconductor apparatus of claim 1, wherein the second semiconductor chip has a larger circuit surface than the first semiconductor chip.

8. The semiconductor apparatus of claim 1, wherein the first semiconductor chip is a logic chip, and the second semiconductor chip is a memory chip.

9. The semiconductor apparatus of claim 1, wherein the internal line is a multi-layer thin film disposed at a peripheral part of the second semiconductor chip without the inclusion of independent circuit elements therein.

10. The semiconductor apparatus of claim 9, wherein the peripheral part of the second semiconductor chip faces the peripheral part of the first semiconductor chip.

11. A semiconductor apparatus manufacturing method, comprising:
    forming a first bump on a circuit surface of a first semiconductor chip having an external connection terminal;
    forming a second bump on a circuit surface of a second semiconductor chip and forming a low impedance line having lower impedance than an internal line of the second semiconductor chip on the circuit surface of the second semiconductor chip;
    electrically connecting the first bump and the second bump and electrically connecting the first bump and the low impedance line with the circuit surfaces of the first and the second semiconductor chips facing each other; and
    electrically connecting an external line of the second semiconductor chip and the low impedance line,
    wherein the first semiconductor chip has the external connection terminal at a peripheral part of the first semiconductor chip, and the external connection terminal is provided closer to a periphery of the first chip than the bump is provided to the periphery of the first chip, and
    there is no inclusion of independent circuit elements within the internal line.

12. The semiconductor apparatus manufacturing method of claim 11, wherein
    when electrically connecting the first bump and the low impedance line, the first bump is electrically connected directly to the low impedance line, and
    when electrically connecting the external line of the second semiconductor chip and the low impedance line, the external line of the second semiconductor chip is electrically connected directly to the low impedance line.

13. The semiconductor apparatus manufacturing method of claim 11, wherein when forming the low impedance line, the low impedance line is formed on top of the circuit surface of the second semiconductor chip.

14. The semiconductor apparatus manufacturing method of claim 11, wherein the low impedance line is formed by plating.

15. A semiconductor apparatus comprising:
    a first semiconductor chip having a first pad; and
    a second semiconductor chip having a connection line electrically connecting the first pad and an external line, the second semiconductor chip being electrically connected to the first semiconductor chip through a bump,
    wherein the connection line is formed on top of the second semiconductor chip and has lower impedance than an internal line of the second semiconductor chip,
    the first semiconductor chip has the first pad at a peripheral part of the first semiconductor chip, and
    the first pad is provided closer to a periphery of the first chip than the bump is provided to the periphery of the first chip and
    there is no inclusion of independent circuit elements within the internal line.

16. The semiconductor apparatus of claim 15, wherein the connection line has a larger film thickness than the internal line of the second semiconductor chip.

17. The semiconductor apparatus of claim 15, wherein the connection line has a larger width than the internal line of the second semiconductor chip.

18. The semiconductor apparatus of claim 15, wherein an internal circuit of the first semiconductor chip and an internal circuit of the second semiconductor chip are electrically connected by a conductive bump.

19. The semiconductor apparatus of claim 15, wherein the connection line extends from a peripheral part of the second semiconductor chip to a part of the semiconductor chip facing a peripheral part of the first semiconductor chip, is electrically connected to the external line in the peripheral part of the second semiconductor chip, and is electrically connected to the first pad in the part of the semiconductor chip facing the peripheral part of the first semiconductor chip.

20. The semiconductor apparatus of claim 15, wherein the connection line is electrically connected to the first pad by a bump and electrically connected to the external line by bonding.

21. The semiconductor apparatus of claim 15, wherein the second semiconductor chip further comprises:
    a second pad electrically connected to the external line by bonding;
    a first internal line electrically connecting the second pad and the connection line; and
    a second internal line electrically connecting the first pad and the connection line via a bump.

22. The semiconductor apparatus of claim 15, wherein the connection line is a line for supplying power to the first semiconductor chip and/or the second semiconductor chip.

* * * * *